United States Patent [19]

Proebsting

[11] Patent Number: 4,593,214

[45] Date of Patent: Jun. 3, 1986

[54] CIRCUIT FOR DISCHARGING BOOTSTRAPPED NODES IN INTEGRATED CIRCUITS WITH THE USE OF TRANSISTORS DESIGNED TO WITHSTAND ONLY THE NORMAL VOLTAGE

[75] Inventor: Robert J. Proebsting, Argyle, Tex.

[73] Assignee: Thomson Components - Mostek Corporation, Carrollton, Tex.

[21] Appl. No.: 568,553

[22] Filed: Jan. 5, 1984

[51] Int. Cl.[4] .................... H03K 17/10

[52] U.S. Cl. .................... 307/578; 307/200 B; 307/450; 307/482; 307/304

[58] Field of Search .................... 307/200 B, 450, 571, 307/574, 581, 264, 304, 482, 578; 357/23.8, 42, 23.12

[56] References Cited

U.S. PATENT DOCUMENTS 3,991,326 11/1976 Kawagoe et al. .............. 307/574 X
4,069,430 1/1978 Masuda .............. 307/450 X
4,296,335 10/1981 Simcoe .............. 307/200 B
4,318,040 3/1982 Hilbourne .............. 307/304 X
4,384,216 5/1983 Pricer .............. 307/450 X
4,429,237 1/1984 Cranford, Jr. et al. ..... 307/200 B X
4,495,427 1/1985 Cartwright, Jr. et al. ..... 307/450 X

OTHER PUBLICATIONS

Baran et al, "High Voltage Field-Effect Transistor", IBM Tech. Disc. Bull., vol. 22, No. 1, Jun. 1979 p. 134.

*Primary Examiner*—Stanley D. Miller
*Assistant Examiner*—D. R. Hudspeth

[57] ABSTRACT

A sub-circuit for discharging a relatively high voltage node in an integrated circuit includes an enhancement transistor connected between ground and an intermediate node and a depletion transistor connected between the intermediate node and the high voltage node, both of the transistors having the same gate voltage.

4 Claims, 3 Drawing Figures

CIRCUIT FOR DISCHARGING BOOTSTRAPPED NODES IN INTEGRATED CIRCUITS WITH THE USE OF TRANSISTORS DESIGNED TO WITHSTAND ONLY THE NORMAL VOLTAGE

DESCRIPTION

1. Technical Field

The field of the invention is that of MOS integrated circuits which have a few nodes at relatively high voltage.

2. Background Art

In N channel field effect transistors of the type commonly used in integrated circuits, it is characteristic that there is a high field region near the drain of the transistors. During drain to source conduction, this high field region can make a few electrons sufficiently energetic that they create electron-hole pairs by impact ionization of the semiconductor through which they pass. If the amount of impact ionization is sufficiently great, it can cause reliability problems because some of the electrons so released can be trapped in the gate oxide of the transistor, which changes the threshold voltage of the transistor. The substrate current of the transistor is also increased by the drain to source current due to the holes which are caused by impact ionization. These problems have been addressed in a number of ways, known to those skilled in the art. It is possible to make a reasonable tradeoff between the physical dimensions of the transistor, the substrate doping level in the transistor channel, the voltage across it and other parameters to reduce impact ionization to a tolerable level.

Integrated circuits are presently designed so that a uniform voltage, the supply voltage, is applied to various nodes throughout the entire circuit. The transistors within the circuit will naturally be designed to handle that voltage with a tolerable degree of impact ionization. In many circuits, however, a small number of nodes will be raised to a voltage above the power supply voltage by well known "bootstrapping" techniques or otherwise. Typically, the elevated voltage will be one and one-half times the standard voltage, and there is a problem, known in the art, of handling these elevated voltages without a large adverse effect from impact ionization. These nodes could be handled by designing special transistors for the high voltage nodes, but that would result in a substantial increase in the number of processing steps and an associated increase in cost.

The art has sought a method of discharging a high voltage node using transistors that are formed by the same processes as those used with the low voltage nodes. Merely increasing the channel length of a transistor or putting two or more enhancement transistors in series helps but does not solve the problem. This is because most of the voltage drop is in the immediate vicinity of the high voltage drain node.

A voltage reference circuit used in the prior art that operates differently employs an enhancement transistor, with its gate tied to its drain, and its source tied to ground connected in series with a depletion transistor with its gate connected to ground and its drain connected to the supply voltage. This circuit is used to provide a temperature stable voltage reference at the node between the two transistors that is insensitive to small fluctuations in the supply voltage. It is a DC circuit, in that it is on all the time and carries the standard power supply voltage, not an elevated voltage.

DISCLOSURE OF INVENTION

The invention relates to a circuit comprising an enhancement transistor connected between ground and an intermediate node and a depletion transistor connected between the intermediate and a high voltage node, both gates of the two transistors being connected to a common controlling gate voltage.

One feature of a preferred embodiment of the invention is that both transistors have the same channel width.

Another feature of the invention is that both transistors are formed by the same processes as the remainder of transistors used in the circuit.

BEST MODE FOR CARRYING OUT THE INVENTION

Figure 1:
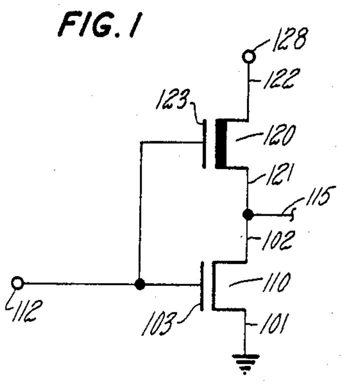
FIG. 1 illustrates a schematic drawing of a circuit constructed according to the invention.

If a node is to be discharged that has a voltage high enough to give excessive hot electron effects with a single standard transistor, one approach that has been tried is to put two or more enhancement transistors in series. This has been found not to work for the same reason that increasing the channel length of a single transistor does not work.

One way of demonstrating that multiple transistors may not solve the problem is to give an example in which the problem is not solved. For example, connect 100 identical enhancement node N-channel transistors, each having a 1 volt threshold in series. Put plus 2 volts on the common gate node of all 100 transistors, tie the source of the first transistor to ground and tie the drain of the 100th transistor to plus 10 volts. Clearly, after equilibrium is reached, current will flow through the string. But for the 100th transistor to have current flow, its gate to source voltage must exceed its 1 volt threshold. Therefore, with its gate at 2 volts, its source must be below 1 volt. This 100th transistor therefore has over 9 volts across it while the other 99 transistors together have a total of less than 1 volt across them. Almost all of the voltage drop occurs in the 100th transistor.

A very long channel transistor can be thought of and will behave as a string of short channel individual transistors. The portion of the channel nearest the source corresponds to the first transistor in the example above, and that nearest the drain corresponds to the 100th transistor above. Most of the voltage drop therefore occurs in the very end of the channel near the drain. Thus there is a very high electric field near the drain and it is this field (with current flow) that causes the hot electrons. The foregoing example demonstrates that the drain region of a saturated field effect transistor always has a relatively high electric field. As was mentioned above, it is possible to design transistors that will withstand high voltages, but at an extra cost or by compromising other transistor characteristics.

Referring now to FIG. 1, a circuit constructed according to the invention employs two transistors, enhancement transistor 110 connected between ground and intermediate node 115 and depletion transistor 120 connected between node 115 and high voltage node 128. High voltage nodes are used to increase the switching speed of transistors; to increase the degree of turn-on; to pull a node all the way to the supply voltage; or for other reasons. The use of the high voltage node and the remainder of the circuit form no part of this invention, which is only concerned with discharging a high voltage node. Both transistors have a common source of gate voltage, shown as node 112 in the drawing. Transistor 110 has source 101 connected to ground, gate 103 connected to node 112 and drain 102, connected to intermediate node 115. Transistor 120 has source 121 connected to intermediate node 115, gate 123 connected to node 112 and drain 122 connected to the high voltage node 128 to be discharged. Depletion-mode transistor 120 behaves much like an enhancement mode transistor having a battery in series with its gate with the positive terminal toward the gate. The voltage of the battery is the sum of the magnitude of the depletion transistor pinch-off voltage and the enhancement transistor threshold voltage.

The ability of the circuit to divide the voltage on node 128 so that the voltage across each transistor remains within standard limits depends on the properties of saturated transistors. The well-known I-V curve for transistors demonstrates that, for a given value of gate-to-source voltage (turn-on voltage), the current between drain and source does not depend on the value of the drain to source voltage, once that voltage passes a certain threshold value (as long as it remains below breakdown voltage).

In order to use the standard I-V transistor curves as an aid in understanding the circuit operation, it should be noted that, under conditions that are explained below, the voltage on node 128 does not affect the voltage on node 115. This insensitivity to the node 128 voltage will be used to set the parameters of the circuit to permit safe operation. The relevant parameters to be considered, then, are the current and the turn-on voltage. Since this is a series circuit, the current passing through transistors 110 and 120 must be the same (excluding capacitance), so that the factor controlling the division of voltage will be the degree to which the two transistors are turned on.

In that case, there is an attractive way to analyze the situation: If two transistors are in series, both must carry the same current (assuming capacitive effects and current drain from node 115 may be neglected). If both have the same channel width and channel length and both are in saturation, then both must have the same turn-on voltage in order to carry the same current. The turn-on voltage of transistor 110, whose source is at ground, is Vin−Vt, where Vin is the voltage on node 112 and Vt is the threshold voltage of enhancement mode transistor 110. The turn-on voltage of transistor 120, whose source node 115 is at a voltage V, is Vin−V+Vp, where Vp is the pinch-off voltage of depletion mode transistor 120. Since both transistors carry the same current, we can equate the turn-on voltage for both transistors, with the result:

$$Vin - Vt = Vin - V + Vp \quad (1)$$

where Vin is the voltage on node 112, Vt is the threshold voltage of transistor 110, V is the voltage on node 115 and Vp is the pinch-off voltage of transistor 120. Rearranging, we see $V = Vt + Vp$, so that the voltage on node 115 is set by the combination of the threshold voltage of the standard enhancement transistor and the pinch-off voltage of the depletion transistor. For standard integrated circuit processing and for a circuit designed to operate from a 5 Volt supply voltage, the threshold voltage of the enhancement transistor typically will be set at about one volt and the pinch-off voltage of the depletion transistor will typically be set at about three volts. Therefore, the voltage on node 115 will be about 4 volts, under the conditions specified above.

For the assumed circuit supply voltage of 5 volts, which is the value presently used in the industry, a typical bootstrapped node will rise to 8 or 9 volts. Node 115 will have a voltage of 4 volts for any voltages of Vin and of the high voltage node for which both transistors are in saturation. In this case, with transistor parameters Vt=1 volt and Vp=3 volts, node 115 will be at 4 volts for any value of Vin between 1 and 5 volts when node 128 is at or above 8 volts. The voltage drop across transistor 110 will then be only 4 volts, within the design values for the standard transistors in the circuit. The voltage across transistor 120 will be 9 volts minus 4 volts or 5 volts and transistor 120 will also be within the design value for standard transistors. Thus, this circuit divides the bootstrapped voltage of node 128 into 2 portions, both of which are within the design limits of standard-process transistors. If the voltage on node 128 were even higher, a second depletion transistor could be put in series between transistor 120 and node 128. This additional transistor would either need a higher voltage on its gate than that of node 112 or would need to be fabricated to have a larger width-to-length ratio than that of the other transistors.

As the voltage on node 128 falls from an initial value of, say, 9 volts, the voltage on node 115 remains constant at 4 volts until the voltage on node 128 falls below the saturation threshold of transistor 120 (V128≧Vin+Vp) of 7 volts, for Vin=4 volts and Vp=3 volts. At that time, transistor 110 is still saturated (V115≧Vin−Vt), since the 4 volts on node 115 is greater than the limit of 3 volts for the right-hand side of the foregoing inequality. Transistor 110 acts as a current sink, since it is saturated, and the intermediate node 115 now starts to discharge as node 128 continues to discharge. Node 115 has whatever instantaneous voltage is required for transistor 120 to have the same current as does saturated transistor 110.

When the voltage on node 115 reaches 3 volts, transistor 110 goes out of saturation. Its current therefore decreases, and the rate of discharge of node 128 decreases. Two important conclusions can be drawn about the discharge process from this example. First, the voltage on node 115 starts at 4 volts, remains at 4 volts for the first part of the discharge of node 128, and then discharges, never exceeding 4 volts. Second, the voltage difference between node 115 and node 128 starts at 5 volts, decreases to 3 volts before node 115 starts to discharge, and monotonically decreases from 3 volts to 0 volts as the current permitted to pass through transistor 110 decreases. Therefore, neither transistor ever has a voltage greater than 5 volts across it.

Figure 2:
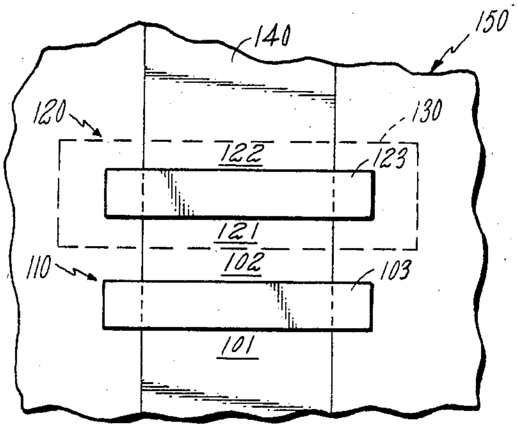
FIG. 2 illustrates one layout of a circuit constructed according to the invention.

An advantageous feature of the circuit is that both transistors have the same channel width, so that the layout is very easy. In FIG. 2, a portion of substrate 150 is shown having active region 140. Transistors 110 and 120 are shown with the depletion region of transistor 120 indicated by the dotted line and marked by the numeral 130. The two gates 103 and 123 are shown as two polysilicon strips across the active area and drain 102 and source 121 of the two transistors touch one another along the active region. If different impedance transistors, which would have different channel widths, were used there would be difficulty in devising a layout that would compactly combine the transistors. The connection between gates 103 and 123 is not shown in this figure, as it may be in polysilicon, metal or by any other technique.

Figure 3:
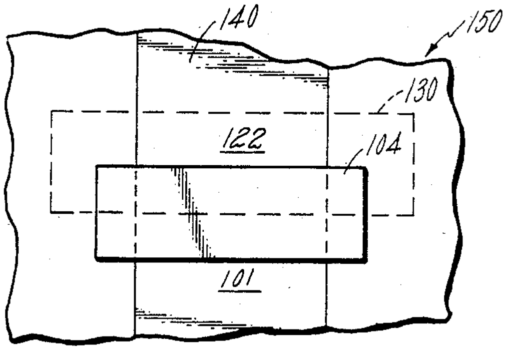
FIG. 3 illustrates an alternative layout of the invention.

An alternate layout is shown in FIG. 3, in which substrate 150 and active region 140 are the same but there is now a single gate 104 common to both transistors, only the drain part of the channel region being depletion mode. This layout may equivalently be regarded as a single transistor that has a channel region, divided across the channel width, that is half depletion and half enhancement. A possible practical drawback to this embodiment is that there will inevitably be fluctuations in the alignment of depletion region 130 with respect to the polysilicon gate region 104 which will affect the different channel lengths, but not widths, of the two transistors. The practicality of this embodiment will depend entirely on whether the fluctuations in depletion region 130 and thus the fluctuations in channel length are small enough so that the voltage drop across each of transistors 110 and 120 is within tolerance. In the case of a high voltage node that is bootstrapped up to only 7 to 8 volts, there will be a margin in the voltage drop across each transistor, so that some processing tolerances will be allowable.

I claim:

1. An integrated circuit for discharging a voltage node at a first potential to a second potential comprising a first field-effect transistor having a first gate connected to a first gate voltage, a first source connected to a second potential and a first drain connected to an intermediate node;

a second field-effect transistor having a second gate connected to a second gate voltage, a second source connected to said intermediate node and a second drain connected to said voltage node; characterized in that;

said first field effect transistor is an enhancement transistor; and said second field effect transistor is a depletion transistor and said second gate voltage is equal to said first gate voltage;

said first gate and said second gate are included in a single gate member disposed above an active area formed in a substrate, said first field effect transistor comprising said first source formed in said active area on a first side of said single gate member and a first portion of said single gate member; and said second field effect transistor comprising said second drain formed in said active area on a second side of said single gate member opposite said first side and a depletion-gate portion of said single gate member adjoining said first portion and being disposed above a depletion portion of said active region.

2. An integrated circuit having a plurality of circuit elements having electrodes and being interconnected between a power supply terminal and a ground terminal, which circuit elements have a conventional construction to withstand the application of a predetermined power supply voltage from said power supply terminal on the electrodes thereof without suffering from hot-electron effects, said integrated circuit further including a subcircuit for discharging a bootstrap voltage node having a voltage of magnitude approximately 1.5 times the magnitude of said power supply voltage to ground and comprising:

a first field-effect transistor having a first gate connected to a first gate voltage and first and second electrodes connected to said bootstrap voltage node and to an intermediate node;

a second field effect transistor having a second gate connected to a second gate voltage and first and second electrodes connected to said intermediate node and ground; characterized in that:

said first and second transistors are of said conventional construction and are the only circuit elements in a discharge current path between said bootstrap voltage node and ground;

said first field effect transistor is a depletion transistor of predetermined channel type; and said second field effect transistor is an enhancement transistor of said channel type and said second gate voltage is less than or equal to said first gate voltage and less than said power supply voltage, so that the voltage across either of said first and second transistor is less than said power supply voltage.

3. An integrated circuit according to claim 2, in which said first and second transistors are formed in first and second neighboring portions of an active area in a substrate, said first and second gates being disposed above said first and second neighboring portions and being separated by a predetermined portion of said active area in which said first drain and second source are formed.

4. An integrated circuit according to claim 3, in which said first transistor has a first channel width in said active area and said second transistor has a second channel width in said active area that is substantially equal to said first channel width.

* * * * *